United States Patent [19]
Fujita et al.

[11] Patent Number: 4,755,363
[45] Date of Patent: Jul. 5, 1988

[54] AUTOMATED BIOPOLYMER CRYSTAL PREPARATION APPARATUS

[75] Inventors: Shozo Fujita, Atsugi; Hachiro Yasuda, Isehara; Akio Sugama, Atsugi; Naomi Nakane; Teruo Yagishita, both of Yokohama, all of Japan

[73] Assignee: Fujitsu Limited, Kawasaki, Japan

[21] Appl. No.: 924,330

[22] Filed: Oct. 29, 1986

[30] Foreign Application Priority Data

Oct. 30, 1985 [JP] Japan .................... 60-243149

[51] Int. Cl.$^4$ ............................................. B01D 9/00
[52] U.S. Cl. .................................................. 422/245
[58] Field of Search ................ 422/245, 253, 254

[56] References Cited

U.S. PATENT DOCUMENTS 4,263,010 4/1981 Randolph ..................... 422/245

OTHER PUBLICATIONS

W. Littke & C. John "Protein Single Crystal Growth Under Microgravity", Science, vol. 225, pp. 203-204.

Primary Examiner—Asok Pal
Attorney, Agent, or Firm—Staas & Halsey

[57] ABSTRACT

Preparation of biopolymer crystals is made automatic by an apparatus comprising a reactor system, a solution liquid supply system, temperature control system, and a control unit controlling the supply system and the temperature control system, and preferably, an image recording system.

5 Claims, 10 Drawing Sheets

Fig. 5

| METHOD | SUPPLIED SOLUTION | | VALVE 31 | STATE OF REACTOR AFTER SUPPLY FINISHES |
|---|---|---|---|---|
| | PUMP 29 | PUMP 30 | | |
| BATCH-WISE METHOD | NOT USED | BIOPOLYMER+ BIOPOLYMER INSOLUBILIZING SOLUTION | NOT USED | |
| VAPOR DIFFUSION METHOD | INSOLUBILIZING SOLUTION | BIOPOLYMER SOLUTION | | |
| FREE INTERFACE DIFFUSION METHOD | INSOLUBILIZING SOLUTION | BIOPOLYMER SOLUTION | | |

--- BIOPOLYMER SOLUTION

--- INSOLUBILIZING SOLUTION

--- BIOPOLYMER + INSOLUBILIZING SOLUTIONS

X100   └──┘
       100μm

AUTOMATED BIOPOLYMER CRYSTAL PREPARATION APPARATUS

BACKGROUND OF THE INVENTION

1. Field of the Invention

The present invention relates to an apparatus automatically preparing crystals of a biopolymer such as proteins and nucleic acids in accordance with a predetermined procedure.

2. Description of the Related Art

The atomic level structure determination of proteins by X-ray analysis has been made in molecular biology, protein engineering, etc., and solving the crystal structure of a portion helps in understanding the relationship between the three-dimensional molecular structure or atomic arrangement of the main chain of the amino acid and the enzyme action thereof.

In a crystal structure analysis of a protein, (1) it is necessary to determine the optimum conditions for preparing crystals of the protein with a very small amount of protein sample, and (2) a certain size (about several hundred micrometers) of a crystal is necessary for X-ray diffraction. Many factors have an influence on the crystallization of a protein, including the concentration of a protein, the kind and concentration of a neutral salt and an organic solvent, pH, temperature, and contaminants, etc. To obtain large and satisfactory crystals, the crystallization of a protein under zero gravity in space has been considered and tried.

Heretofore, the preparation of biopolymer crystals has been done manually by skilled persons in accordance with their skill and experience. But considerable time and work are necessary to determine the optimum conditions for crystal preparation, since there are many factors such as the concentration of a biopolymer, the kind and concentration of a biopolymer insolubilizing agent, the ionic strength, pH, and temperature of a reaction solution, etc. Further, in manual operation, the results may be varied by slight differences in procedure, resulting in an undesirable low reproducibility.

K. Nakamura and Y. Mitsui in "Crystallization of Protein by Hanging-drop Method" Rigaku Denki Journal 16, 1985, pp 12–14 describe a hanging-drop method in which a vessel for tissue culture having a plurality of reservoirs is used so that the crystallization conditions of a protein are examined systematically.

In this operation, a sample solution and ammonium sulfate solution are dropped on a coverglass by means of a digital micropipette and combined by means of a fine glass rod. The coverglass is then placed upside down on a reservoir, and this operation is repeated for all reservoirs. This operation is disadvantageous in that, if the operation is not done quickly, water evaporation changes the concentration of the solution.

Other known apparatuses for preparing biopolymer crystals include that disclosed by, for example, Walter Littke and Christina John in "Protein Single Crystal Growth Under Microgravity", SCIENCE, Vol. 225, pp 203–204; and Yuhei Moriguchi in "Crystal Growth of Proteins under Microgravity", "Nihon Kessho Gakkai Shi (Japanese Journal of Crystallography)" 28, 47 (1986) pp 47–49. All of these apparatuses were developed for use in space, but were not intended to provide an automated apparatus. Further, an apparatus for preparing biopolymer crystals in a land-based laboratory has not been proposed.

SUMMARY OF THE INVENTION

The object of the present invention is to provide an automated apparatus for preparing biopolymer crystals, in which the optimum conditions for crystal preparation are automatically determined and reproducibility of the biopolymer crystals is improved.

The above and other objects, features, and advantages are attained by an automated apparatus for preparing biopolymer crystals, comprising: (a) a reactor system in which biopolymer crystals are grown; (b) a supply system comprising reservoirs, pipes, a pump, and switch valves for supplying reaction solutions to the reactor system; (c) means for controlling the temperature in the reactor system; and (d) means for controlling the supply system and the temperature controlling means in a predetermined procedure for conducting the preparation of biopolymer crystals in the reactor system. Preferably, the apparatus further comprises a system for recording the process of biopolymer crystal growth in the reactor, and the reactor system preferably comprises a plurality of reactors.

According to the present invention, various process and conditions for preparing various crystals can be established or selected as desired through the supply system including the switch valves; a biopolymer solution and biopolymer insolubilizing agent solution can be supplied to the reactor system in desired concentration and flow rate; a plurality of crystal preparations can be conducted concurrently by supplying necessary solutions to each reactor of the plurality of reactors forming the reactor system.

BRIEF DESCRIPTION OF THE DRAWINGS

FIG. 5 shows the operation and conditions of various methods for preparing biopolymer crystals in an apparatus shown in FIG. 2;

DESCRIPTION OF THE PREFERRED EMBODIMENTS

An example of an automated apparatus for preparing biopolymer crystals according to the present invention is described with reference to FIGS. 1 to 9.

Figure 1:
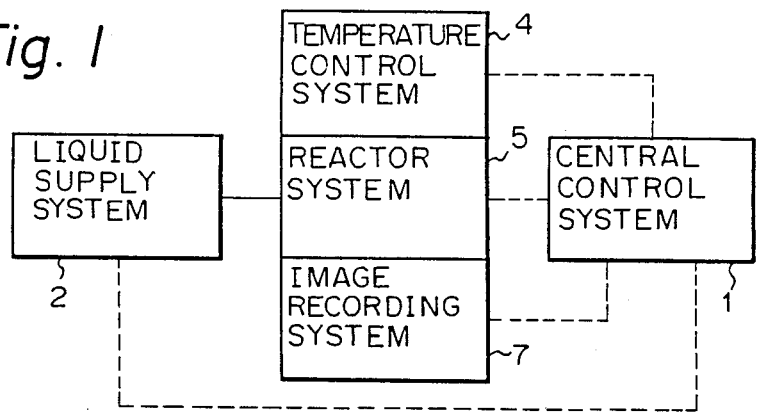
FIG. 1 is a block diagram of an automated apparatus for preparing biopolymer crystals according to the present invention.

FIG. 1 is a block diagram of the apparatus according to the present invention. In the apparatus, under the control of a central control system 1, reaction solutions are sent from a supply system 2 to a reactor system 5, the temperature of which is controlled by a temperature control system 4, and a process of crystallization in the reactor system 5 is recorded by an image recording system 7.

Figure 2:
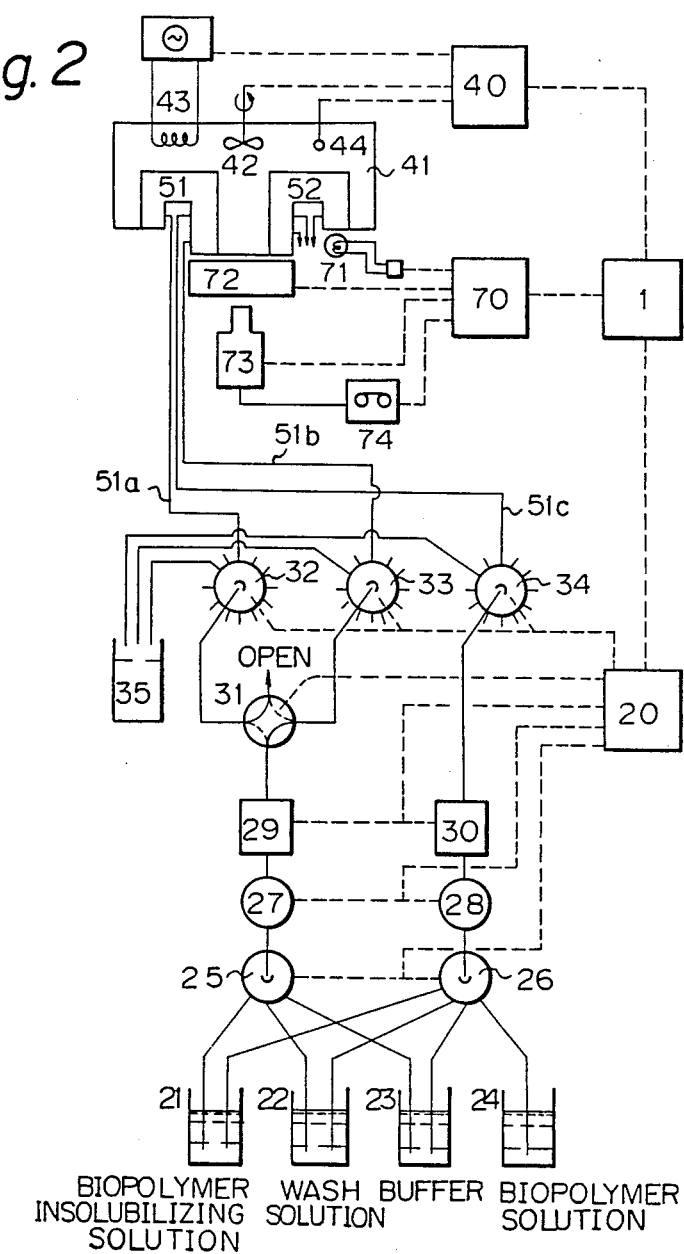
FIG. 2 is a schematical diagram of a more detailed construction of an apparatus according to the present invention.

FIG. 2 is a more detailed construction of the apparatus shown in FIG. 1. The supply system 2, in this case, comprises four solution reservoirs 21 to 24 for a biopolymer solution, a biopolymer insolubilizing solution, a buffer, and a wash solution, reaction solution-selecting switch valves 25 and 26, stirrers 27 and 28, a first pump 29, a second pump 30, a liquid passage-selecting switch valve 31, three cooperating twelve-way rotary valves 32 to 34, a waste reservoir 35, and a supply system control device 20 which controls the reaction solution-selecting switch valves 25 and 26, the stirrers 27 and 28, the pumps 29 and 30, the passage-selecting switch valve 31, and the twelve-way rotary valves 32, 33 and 34. In FIG. 2, the four solution reservoirs 21 to 24 may have a cap or they may be a closed system, if desired.

Figure 3A:
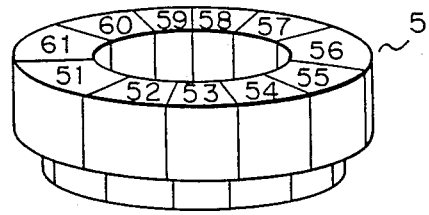
FIGS. 3A and 3B are perspective and sectional views of reactors and pipes connected thereto.
Figure 3B:
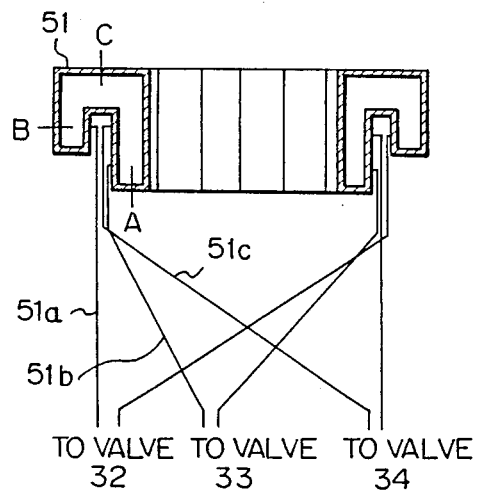

FIGS. 3A and 3B are perspective and sectional views of the reactor system 5, respectively. The reactor system 5 comprises eleven reactors 51 to 61 and pipes 51a to 61a, 51b to 61b and 51c to 61c connecting between each of the reactors 51 to 61 and each of the three twelve-way rotary valves 32 to 34. In FIG. 2, only one set of the pipes 51a, 51b, and 51c is shown for simplicity.

Each reactor comprises an inner peripheral vessel A, an outer peripheral vessel B, and a connecting part C connecting the inner and outer peripheral vessels A and B. The connecting part C has a structure by which the liquids in the inner and outer peripheral vessels A and B can be kept separate but vapor diffusion allowed therebetween. Preferably, the reactors are made of a transparent material such as glass or plastic to allow the state of the crystal growth to be recorded by the image recording system 7.

The pipes 51a to 61a are connected to the twelve-way rotary valve 32, the pipes 51b to 61b are connected to the twelve-way rotary valve 33, and the pipes 51c to 61c are connected to the twelve-way rotary valve 34, respectively.

FIG. 3A illustrates the reactor system 5 which is composed of eleven reactors 51 to 61 and is in the shape of a doughnut.

FIG. 3B illustrates the connections between the respective reactors and twelve-way rotary valves.

In FIG. 2, the temperature control system 4 comprises a heat accumulating chamber 41, a stirrer 42, a heater 43, a heat sensor 44, and a control device 40 in the temperature control system 4, which device controls the heater 43 and the stirrer 42 by signals from the heat sensor 44. In this example, the reactors 51 to 61 are surrounded by or included in the heat accumulating chamber 41. In order to carry out image recording, preferably at least a part of the heat accumulating chamber 41 used in an image recording optical system is transparent.

The image recording system 7 comprises an illuminating light source 71, a light-passage switching mirror and a driving unit 72 thereof, a TV camera 73, a video tape recorder 74, and a control device 70 in the image recording system which device controls the light source 71, a unit of the mirrors and the drive 72 thereof, the TV camera 73, and the video tape recorder 74, etc.

Figure 4A:
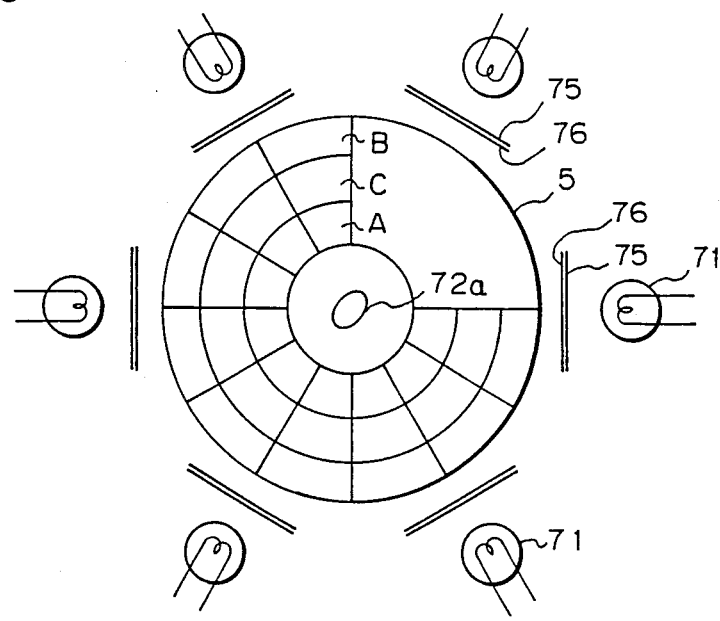
FIGS. 4A and 4B are plane and sectional views of a reactor and an optical system for image recording.
Figure 4B:
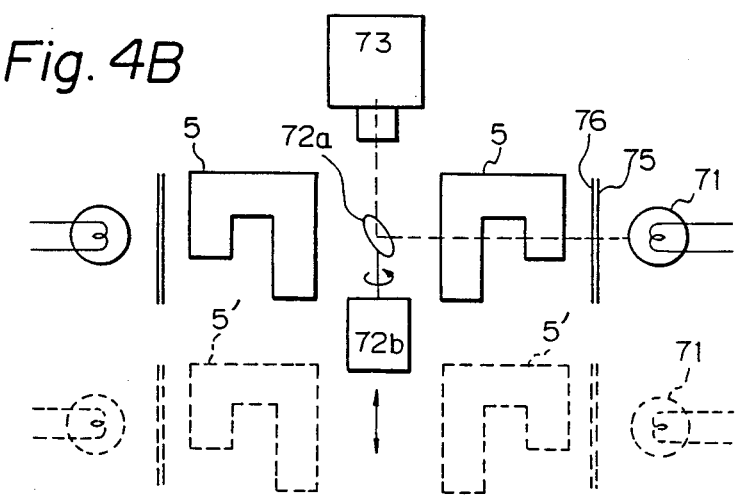

FIGS. 4A and 4B illustrate a more detailed construction of the unit of the light passage switching mirror and the drive 72 thereof. FIG. 4A is a plane view and FIG. 4B is a sectional view, in which light from the light source 71 passes through a heat absorbing filter 75 and a scattered light filter 76, then passes through a desired reactor, is reflected by an optical pass switching mirror 72a, and reaches the TV camera to project images of the biopolymer crystals therein. The optical pass switching mirror 72a enables the observation and image recording of the state of crystal growth in the desired reactor, by rotation or vertical movement made by a driving unit 72b.

As seen in FIG. 4B, reactors may be provided at multiple levels, as shown by reactors 5 and 5'. In such a case, the optical pass switching mirror 72a is moved downward when recording at the lower reactor 5' is to be done. The TV camera 73 is preferably movable.

In FIG. 2, the supply-system control device 20, the temperature control-system control device 40 and the image recording-system control device 70 are controlled by a central control device 1.

Examples for preparing biopolymer single crystals by (1) a batch-wise method; (2) a vapor diffusion method; and, (3) a free interface diffusion method, using the automated apparatus for preparing biopolymer crystals shown in FIG. 2, are described below.

The operation of the pumps 29 and 30 and valve 31 and the state of a reaction solution in a reactor in the above three kinds of methods for preparing biopolymer crystals are shown in FIG. 5. As seen in FIG. 5, in the batch-wise method, a mixture of biopolymer and insolubilizing solutions is charged in a vessel of a reactor and allowed to stand. In the vapor diffusion method, a biopolymer solution and an insolubilizing agent solution are charged in two vessels separately and then diffused from one solution to the other solution. In the free interface diffusion method, a biopolymer solution and an insolubilizing agent solution are charged in a vessel of a reactor as separate layers forming the interface therebetween and ingredients of the solutions then diffused into each of the solutions.

The batch-wise method is carried out by keeping an oversaturated biopolymer solution stationary to nucleate, crystallize, and grow biopolymer crystals from the solution. The oversaturated biopolymer solution containing a high salt concentration is prepared by the process of dissolving a biopolymer in water or an aqueous buffer solution, followed by adding a salt solution to the biopolymer solution.

The vapor diffusion method is carried out by diffusing $H_2O$ vapor (or an organic solvent vapor) in a biopolymer solution passing through the vapor phase equilibrated between the biopolymer solution and an aqueous salt solution (or an organic solvent solution) separated from each other in a closed system. When using an aqueous salt solution, the biopolymer solution is concentrated by diffusing water vapor from the solution to the aqueous salt solution because of a diluted concentration of the aqueous salt solution. When using an organic solvent solution, organic solvent vapor is dissolved into a biopolymer solution. In either case, the biopolymer solution becomes oversaturated by vapor diffusion.

The free interface diffusion method is carried out by forming separate layers of a biopolymer solution and an aqueous salt solution or an organic solvent solution, one on top of the other. Crystallization and growth of the biopolymer crystals occur near the free interface of the solutions where oversaturation is attained, by diffusion with each other.

As the buffer, acetic acid, phosphoric acid, trisulfuric acid buffers may be exemplified. As the neutric salt, ammonium sulfate, phosphate, sodium chloride, magnesium sulfate, cerium chloride, etc., may be exemplified.

First, an example of the vapor diffusion method is described with reference to FIG. 6A.

A 2% aqueous solution of sperm whale myoglobin (produced by Sigma Chemical Co., USA) was used as the biopolymer solution 24 and a saturated aqueous solution of ammonium sulfate as an insolubilizing solution 21.

Figure 6A:
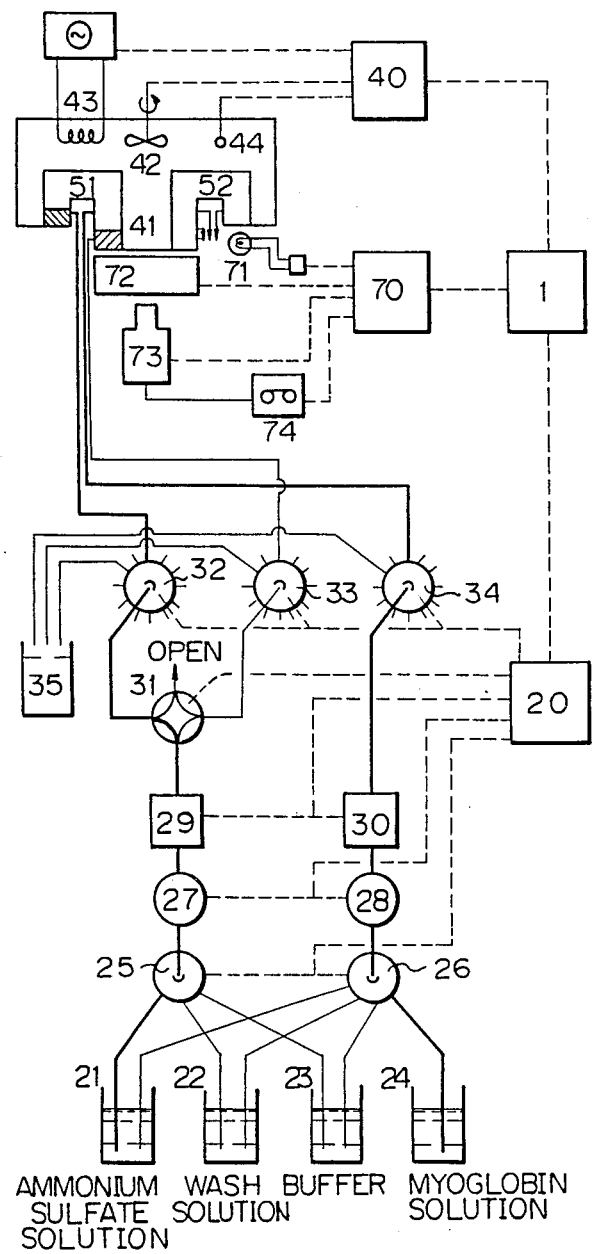
FIGS. 6A, 6B, and 6C are schematical diagrams of an apparatus shown in FIG. 2, showing the operation for different methods.

The pipes used in this operation are shown by thickened lines in FIG. 6A. The pump 30 was operated at a speed of 1 ml/min, and the valve 26 appropriately switched such that the sampling times, by the valve 26, of the ammonium sulfate solution 21, the buffer 23 and the myoglobin solution 24 are in the ratio of 70:5:25 and the resultant mixture is stirred by the stirrer 28 to obtain a 0.5% myoglobin solution.

After connecting the valve 34 to the waste reservoir 35 to wash the pipe, the valve 34 was connected to the reactor 51 and 1 ml of the above solution supplied therein. At the same time, by operating the pump 29 at a speed of 1 ml/min, the saturated solution of ammonium sulfate 21 was sent through the valve 31 to the valve 32. 1 ml of the solution 21 was supplied to the reactor 51 after washing the pipe. As a result, the two solutions were charged in the two vessels A and B of the reactor 51, as shown in FIGS. 5 and 6A. During the above operation, excess gas in the reactor 51 was discharged through the valves 33 and 31, as a result of the introduction of the solutions into the reactor 51.

Subsequently, reaction solutions could be supplied to the other reactors 52 to 61 respectively by switching the valve 32 to 34 in a similar manner to that described above. Here, if desired, different crystallization methods or conditions may be selected for any of the other reactors 52 to 61 by changing the operation of the pumps and the valves. Thus, different crystallization methods and/or conditions can be established in the same apparatus.

Figure 6B:
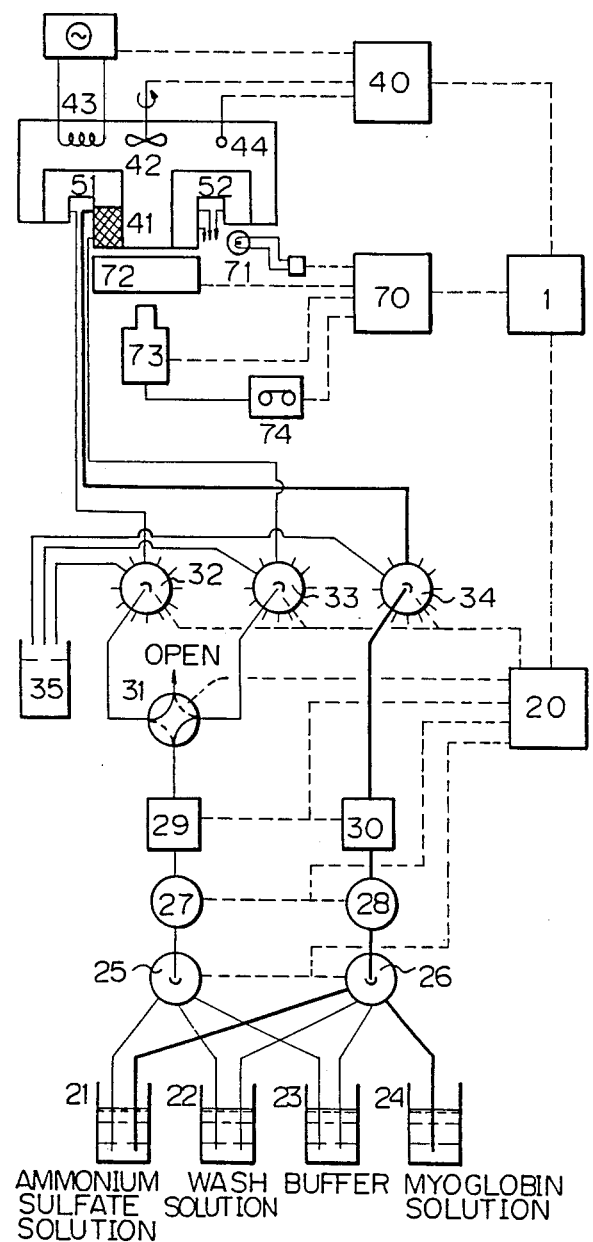
Figure 6C:
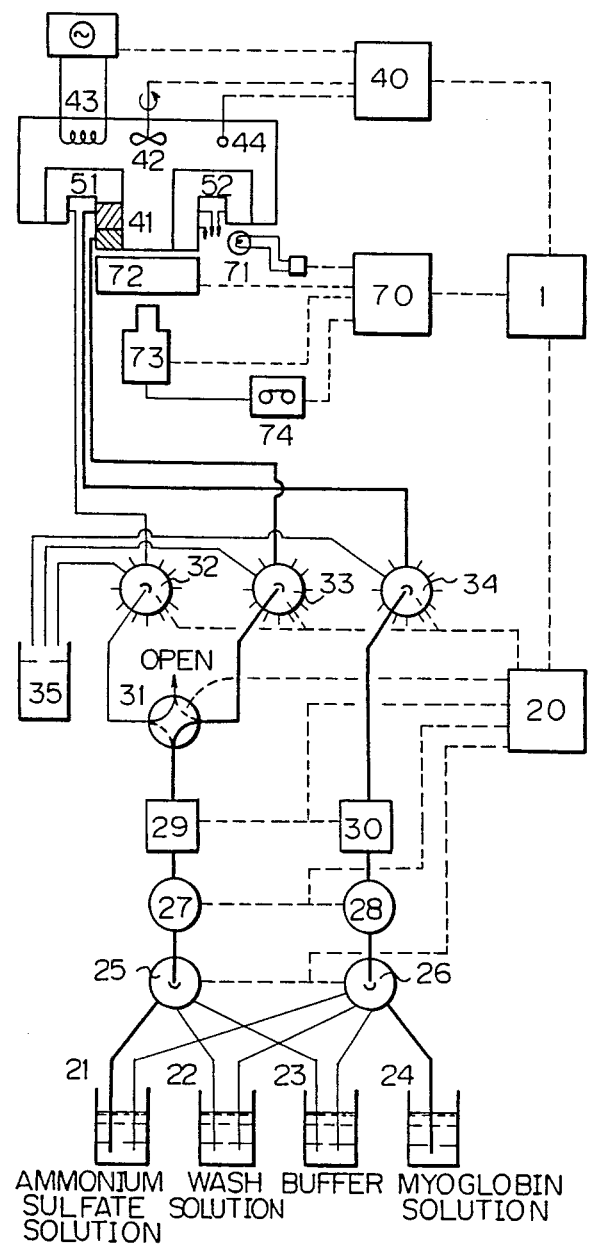

The operations for the batch-wise method and the free interface diffusion method are shown in FIGS. 6B and 6C, respectively.

Finally, the pipes were washed with the wash solution 22 and the waste removed and sent to the waste reservoir 35.

The temperature in the reactors 51 to 61 was then controlled by the temperature control system 4 for a time period required for crystal growth. The growth of crystals in the reactors 51 to 61 was observed and recorded by the image recording system 7. The growth of crystals can be visually inspected, if necessary.

The conditions for crystal growth in the three methods in the above experiments are shown in Table 1. In Table 1, the concentration of the myoglobin solution means that concentration in the reactor, and the 80% saturation of the ammonium sulfate solution means a mixture of the 100% saturated ammonium sulfate solution and the buffer in a ratio of 4:1.

TABLE 1

| Method | Concentration of myoglobin solution | Concentration of ammonium sulfate solution |
|---|---|---|
| Batch-wise method | 0.5 wt % | 80% saturation |
| Vapor diffusion method | 0.5 wt % | 80% saturation |
| Free interface diffusion method | 0.5 wt % | 100% saturation |

Figure 7:
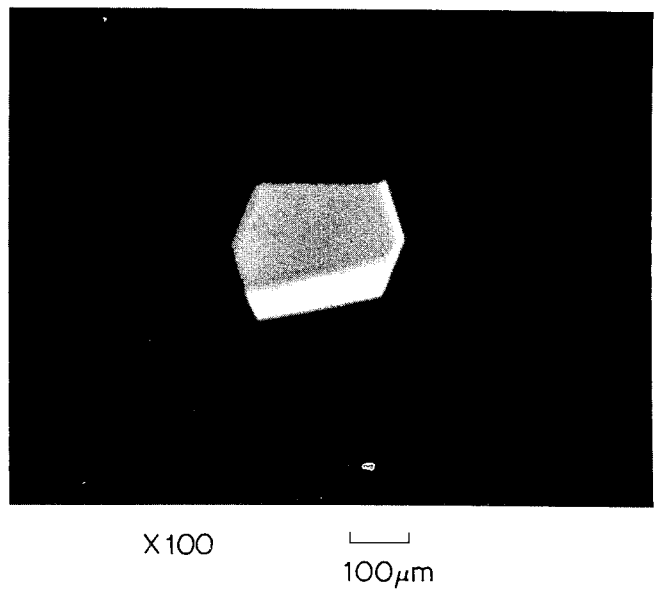
FIG. 7 is a photograph of a single crystal of myoglobin obtained in an experiment according to the present invention.

A myoglobin single crystal obtained as a result of the above operation is shown as a photograph in FIG. 7. The size of this crystal is about 100 μm.

According to the present invention, the operation of preparing biopolymer crystals is conducted automatically in accordance with a procedure preliminarily set in a central control system. As a result, the operator can be completely or almost freed from operation work. The crystal growth in a method according to the present invention is reproducible and further, different methods and/or conditions of preparing crystals can be conducted at the same time in the reactor system.

By changing the temperature control, crystal growth at a gradually increased or decreased temperature can be carried out in the above apparatus, with a similar procedure.

Figure 8A:
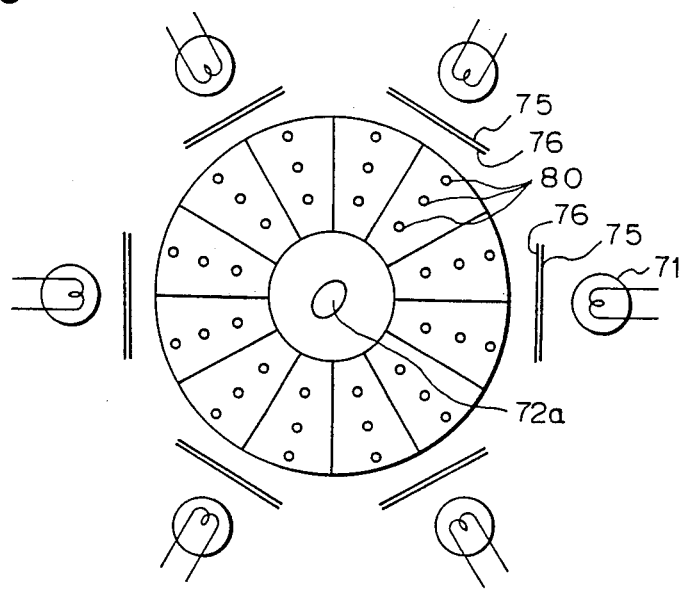
FIGS. 8A and 8B are plane and sectional views of a reactor and an optical system for recording of another apparatus according to the present invention.
Figure 8B:
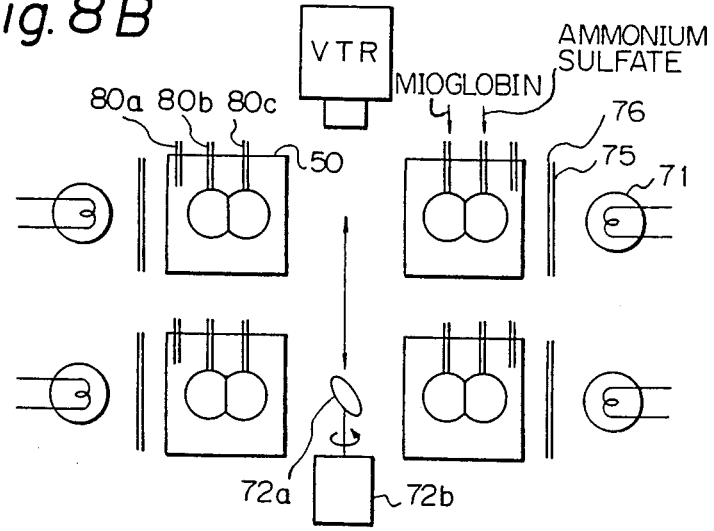

Another apparatus for use under zero gravity is described with reference to FIGS. 8A, 8B, and 9. The apparatus is similar to the apparatus in FIG. 2 except for the reactor. FIGS. 8A and 8B are plane and sectional views of a reactor system and an image recording system of this embodiment.

In FIGS. 8A and 8B, parts or components having similar functions to those of FIGS. 4A and 4B are denoted by the same reference numerals. In this apparatus, liquid supply pipes 80 (80a, 80b and 80c) penetrate the reactors 50 (51 to 61), each of which is a simple closed box and does not have two vessels as does a reactor in FIG. 3. Under zero gravity, if certain amount of liquid is introduced into a reactor 50 through a pipe 80, the liquid forms a sphere outside the end of the pipe and the sphere is suspended from the pipe. Therefore, by introducing biopolymer and insolubilizing agent solutions through two neighboring pipes, e.g., 80b and 80c respectively, two spheres of the biopolymer and insolubilizing agent solutions are formed and these two spheres come into contact with each other, thus forming a free interface between the two solutions. FIG. 8B shows this method. If a mixture of biopolymer and insolubilizing agent solutions is introduced through a pipe, the stationary standing batch method of preparation of crystals can be conducted. If biopolymer and insolubilizing agent solutions are introduced through two pipes 80a and 80c which are separated from each other, two spheres of the solutions can be formed and spaced apart, enabling the vapor diffusion method of preparation of crystals to be carried out.

Figure 9:
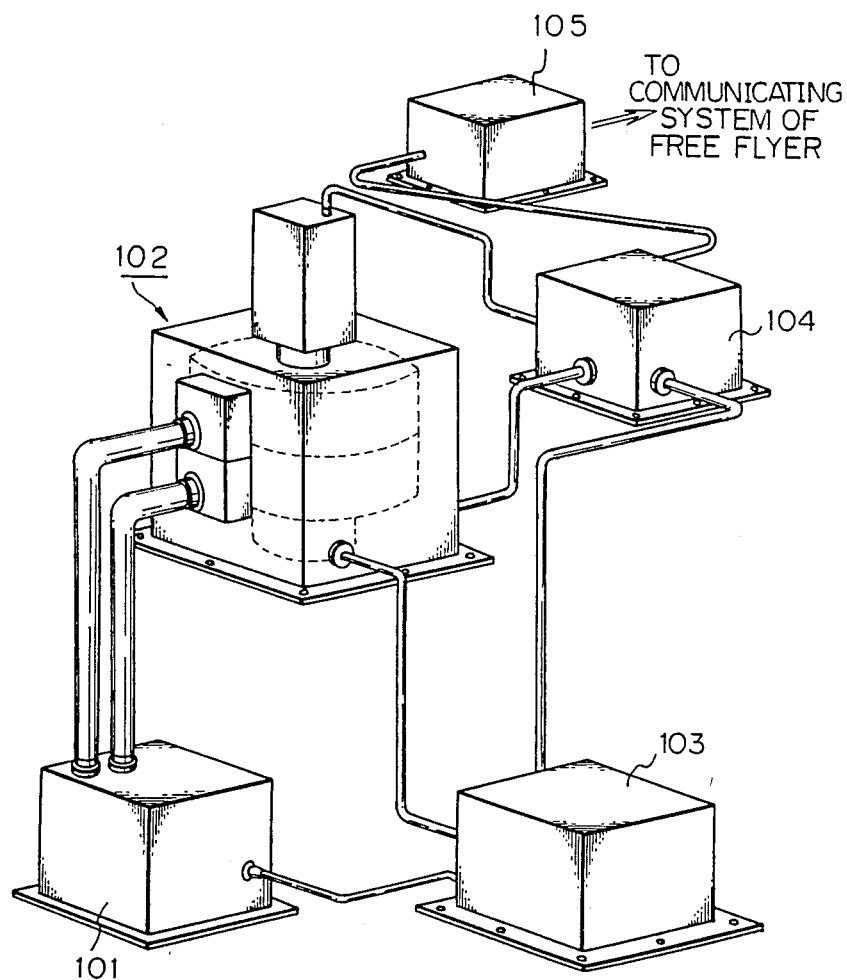
FIG. 9 is a perspective view of an apparatus to be used in free flyer.

FIG. 9 shows a perspective view of an apparatus for preparing biopolymer crystals, intended to be used in a free flyer which is placed in space by a space shuttle and recovered after experiments have been carried out. In FIG. 9, 101 denotes a supply unit, 102 a reactor unit, 103 an electric source and temperature control unit, 104 a recording and controlling unit, and 105 a data processing unit. The data processing unit 105 is connected to a communicating system of the free flyer. By providing the data processing unit 105, the apparatus for preparing crystals can be controlled on the earth in a desired procedure and can transmit images of crystal growth in the reactor to the earth, by communication between the free flyer and the earth.

We claim:

1. An automated device for preparing biopolymer crystals alternatively employing batch-wise procedures, vapor diffusion procedures or free interface diffusion procedures, and either zero or normal gravity conditions, said device comprising:

a reactor system including a reactor comprising a first vessel defining a first reaction space, a separate second vessel defining adjacent, separate second and third reaction spaces, and vapor conduit means interconnecting the vessels in open vapor phase communication;

a liquid supply system including, (a) separate respective reservoirs for each of (1) a biopolymer solution, (2) a biopolymer insolubilizing solution, (3) a buffer solution and (4) a wash solution, (b) conduit means for facilitating transfer of fluid from the reservoirs to said reaction spaces, said conduit means comprising separate, respective spaced conduits leading to each of said reaction spaces and (c) valve means associated with said conduit means for selectively mixing selected solutions and selectively directing selected mixed or unmixed solutions to selected reaction spaces, said reaction spaces of the reactor being arranged to facilitate batch-wise reaction of a mixture of fluids received in a selected space, vapor phase diffusion reaction of separate fluids received separately in said first and second spaces and free interface diffusion reaction of separate fluids received separately in said second and third spaces;

means for controlling the temperature in the reactor system; and means for controlling the supply system and the temperature controlling means in accordance with a predetermined procedure to prepare biopolymer crystals by a desired method and under desired conditions.

2. An automated device as set forth in claim 1, wherein said reactor system comprises a plurality of said reactors and said liquid supply system is adapted to deliver selected mixed or unmixed solutions to each reactor separately.

3. An automated device as set forth in claim 2, wherein said reactors are arranged in the shape of a donut.

4. An automated device as set forth in claim 1, wherein is included means for image-recording the growth of biopolymer crystals in the reactor system.

5. An automated device for preparing biopolymer crystals alternatively employing batch-wise procedures, vapor diffusion procedures or free interface diffusion procedures, and either zero or normal gravity conditions, said device comprising:

a reactor system including a reactor unit defining first, second and third reaction spaces, said second and third spaces being disposed in closely spaced adjacency relative to one another and being spaced from said first reaction space and arranged in vapor phase communication therewith;

a liquid supply system including, (a) separate respective reservoirs for each of (1) a biopolymer solution, (2) a biopolymer insolubilizing solution, (3) a buffer solution and (4) a wash solution, (b) conduit means for facilitating transfer of fluid from the reservoirs to said reaction spaces, said conduit means comprising separate, respective spaced conduits leading to each of said reaction spaces and (c) valve means associated with said conduit means for selectively mixing selected solutions and selectively directing selected mixed or unmixed solutions to selected reaction spaces, said reaction spaces of the reactor being arranged to facilitate batch-wise reaction of a mixture of fluids received in a selected space, vapor phase diffusion reaction of separate fluids received separately in said first and second spaces and free interface diffusion reaction of separate fluids received separately in said second and third spaces;

means for controlling the temperature in the reactor system; and means for controlling the supply system and the temperature controlling means in accordance with a predetermined procedure to prepare biopolymer crystals by a desired method and under desired conditions.

* * * * *